(12) United States Patent
Shen et al.

(10) Patent No.: US 9,385,108 B2
(45) Date of Patent: Jul. 5, 2016

(54) LIGHT-EMITTING DEVICE HAVING OPTOELECTRONIC ELEMENTS ON DIFFERENT ELEVATIONS

(71) Applicant: Epistar Corporation, Hsinchu (TW)

(72) Inventors: Chein-Fu Shen, Hsinchu (TW);
Schang-Jing Hon, Taichung (TW);
Tsun-Kai Ko, Yongkang (TW);
Alexander Chan Wang, Hsinchu (TW);
Min-Hsun Hsieh, Hsinchu (TW);
Cheng Nan Han, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/678,668

(22) Filed: Apr. 3, 2015

(65) Prior Publication Data

US 2015/0214196 A1  Jul. 30, 2015

Related U.S. Application Data

(62) Division of application No. 13/186,218, filed on Jul. 19, 2011, now Pat. No. 9,000,457.

(51) Int. Cl.
*H01L 21/20* (2006.01)
*H01L 25/075* (2006.01)
(Continued)

(52) U.S. Cl.
CPC .............. *H01L 25/0753* (2013.01); *F21K 9/00* (2013.01); *H01L 33/50* (2013.01); *H01L 33/60* (2013.01); *F21Y 2101/02* (2013.01); *F21Y 2105/003* (2013.01); *F21Y 2113/005* (2013.01); *H01L 33/505* (2013.01); *H01L 2224/48091* (2013.01); *H01L 2224/48137* (2013.01); *H01L 2924/0002* (2013.01)

(58) Field of Classification Search
CPC ........ H01L 25/075; H01L 33/60; H01L 33/50
USPC ............... 257/79, 88, 89, 98, 99; 362/249.09, 362/249.14, 231
See application file for complete search history.

(56) References Cited

U.S. PATENT DOCUMENTS 5,688,551 A * 11/1997 Littman et al. .................. 427/64
5,813,753 A * 9/1998 Vriens et al. .................. 362/293
(Continued)

FOREIGN PATENT DOCUMENTS

CN    201069057 Y    6/2008
CN    201535450 U    7/2010
(Continued)

*Primary Examiner* — Caleb Henry
(74) *Attorney, Agent, or Firm* — Ditthavong & Steiner, P.C.

(57) ABSTRACT

The present application provides a multi-dimensional light-emitting device electrically connected to a power supply system. The multi-dimensional light-emitting device comprises a substrate, a blue light-emitting diode array and one or more phosphor layers. The blue light-emitting diode array, disposed on the substrate, comprises a plurality of blue light-emitting diode chips which are electrically connected. The multi-dimensional light-emitting device comprises a central area and a plurality of peripheral areas, which are arranged around the central area. The phosphor layer covers the central area. When the power supply system provides a high voltage, the central area and the peripheral areas of the multi-dimensional light-emitting device provide a first light and a plurality of second lights, respectively. The first light and the second lights are blended into a mixed light.

19 Claims, 12 Drawing Sheets

(51) Int. Cl.
*F21K 99/00* (2016.01)
*H01L 33/60* (2010.01)
*F21Y 101/02* (2006.01)
*F21Y 105/00* (2016.01)
*F21Y 113/00* (2016.01)
*H01L 33/50* (2010.01)

(56) References Cited

U.S. PATENT DOCUMENTS

| | | | | |
|---|---|---|---|---|
| 6,661,029 | B1* | 12/2003 | Duggal | 257/89 |
| 7,045,965 | B2* | 5/2006 | Li et al. | 315/185 S |
| 7,115,429 | B2* | 10/2006 | Ohba et al. | 438/28 |
| 7,157,839 | B2* | 1/2007 | Ouderkirk et al. | 313/111 |
| 7,213,940 | B1* | 5/2007 | Van De Ven et al. | 362/231 |
| 7,221,044 | B2* | 5/2007 | Fan et al. | 257/676 |
| 7,385,574 | B1* | 6/2008 | Van de Ven et al. | 345/82 |
| 7,420,218 | B2* | 9/2008 | Nagai | 257/98 |
| 7,651,234 | B2* | 1/2010 | Lim | 362/97.3 |
| 7,850,321 | B2* | 12/2010 | Wang et al. | 362/84 |
| 7,862,205 | B2* | 1/2011 | Bertram et al. | 362/249.02 |
| 7,998,761 | B2* | 8/2011 | Kim et al. | 438/22 |
| 8,029,165 | B2* | 10/2011 | Livesay et al. | 362/310 |
| 8,071,990 | B2* | 12/2011 | Bogner et al. | 257/98 |
| 8,125,137 | B2* | 2/2012 | Medendorp et al. | 313/501 |
| 8,193,542 | B2* | 6/2012 | Maehara | 257/82 |
| 8,284,350 | B2* | 10/2012 | Abe et al. | 349/68 |
| 8,476,648 | B2* | 7/2013 | Lee et al. | 257/88 |
| 2003/0156425 | A1* | 8/2003 | Turnbull et al. | 362/545 |
| 2004/0080941 | A1* | 4/2004 | Jiang et al. | 362/252 |
| 2004/0218387 | A1* | 11/2004 | Gerlach | 362/231 |
| 2005/0001537 | A1* | 1/2005 | West et al. | 313/500 |
| 2005/0067627 | A1* | 3/2005 | Shen et al. | 257/89 |
| 2005/0253151 | A1* | 11/2005 | Sakai et al. | 257/79 |
| 2005/0254243 | A1* | 11/2005 | Jiang et al. | 362/249 |
| 2006/0044864 | A1* | 3/2006 | Lin et al. | 365/151 |
| 2006/0087866 | A1* | 4/2006 | Ng et al. | 362/612 |
| 2006/0209538 | A1* | 9/2006 | Chang et al. | 362/231 |
| 2007/0091599 | A1* | 4/2007 | Hsieh et al. | 362/231 |
| 2007/0223219 | A1* | 9/2007 | Medendorp et al. | 362/231 |
| 2007/0263384 | A1* | 11/2007 | Hsieh et al. | 362/231 |
| 2008/0048193 | A1* | 2/2008 | Yoo et al. | 257/89 |
| 2009/0001390 | A1* | 1/2009 | Yan et al. | 257/89 |
| 2009/0002986 | A1* | 1/2009 | Medendorp et al. | 362/247 |
| 2009/0108269 | A1* | 4/2009 | Negley et al. | 257/88 |
| 2009/0236619 | A1* | 9/2009 | Chakroborty | 257/89 |
| 2009/0261357 | A1* | 10/2009 | Daniels | 257/88 |
| 2010/0103660 | A1* | 4/2010 | van de Ven et al. | 362/231 |
| 2010/0127283 | A1* | 5/2010 | van de Ven et al. | 257/89 |
| 2010/0301728 | A1* | 12/2010 | Helbing et al. | 313/46 |
| 2011/0050125 | A1* | 3/2011 | Medendorp et al. | 315/294 |
| 2012/0168794 | A1* | 7/2012 | Yu et al. | 257/98 |

FOREIGN PATENT DOCUMENTS

| | | |
|---|---|---|
| TW | 200947665 A | 11/2009 |
| TW | M374001 U | 2/2010 |

* cited by examiner

LIGHT-EMITTING DEVICE HAVING OPTOELECTRONIC ELEMENTS ON DIFFERENT ELEVATIONS

TECHNICAL FIELD

The application relates to a multi-dimensional light-emitting device, and more particularly to a light-emitting device adapted to a standardized power supply system.

REFERENCE TO RELATED APPLICATION

This application claims the right of priority based on Taiwan application Ser. No. 099123630, filed Jul. 19, 2010, and Taiwan application Ser. No. 100106620, filed Feb. 25, 2011, and the content of which is hereby incorporated by reference in its entirety.

DESCRIPTION OF BACKGROUND ART

With the rapid development of the technology, the light-emitting diode (LED) is widely applied to display device, traffic signals, lighting, medical devices and various electronic products.

There are several ways using LEDs to produce white light: (1) mixing blue light, red light, and green light which are respectively generated from blue, red, and green LED(s) to produce the white light; (2) using ultraviolet light-emitting diode(s) exciting phosphor to produce the white light; and (3) using blue LED(s) exciting yellow phosphor to produce the white light by the complementary colors.

Some issues still remain in the aforementioned ways; therefore, the market is looking forward to the technology innovations.

SUMMARY OF THE DISCLOSURE

One purpose of the present application is to provide a multi-dimensional light-emitting device adapted to a standardized power supply system, and has low cost, low electric power consumption, and good color rendering.

To achieve the above purpose, a multi-dimensional light-emitting device is provided to be electrically connected to a standardized power supply system such as power line, network, telephone line, and industrial power supply. The multi-dimensional light-emitting device includes a carrier, a first optoelectronic element, and second optoelectronic elements. A surface of the carrier can have a first region and second regions which are near the first region. The first optoelectronic element is arranged on the first region; and the second optoelectronic elements are arranged on the second regions. However, the materials, the structures, the quantities, the light colors, the color temperatures, the intensities, and the luminous efficiencies of the second optoelectronic elements on the second regions are not limited to the same. The standardized power supply system is electrically connected to the first optoelectronic element and the second optoelectronic elements. The first optoelectronic element can emit a first light; at least part of the second optoelectronic elements can emit a second light which can be mixed with the first light to produce a mixed light. In one embodiment, the first light, the second light, and the mixed light are blue light, red light, and (warm) white light, respectively. In another embodiment, at least one of the first light and the second light is mixed by several color lights. For example, the first light is mixed by blue light and yellow light, and/or the second light is mixed by blue light and red light. In a further embodiment, at least two of the second optoelectronic elements can emit second lights having different colors. For example, one second optoelectronic element can emit red light; another second optoelectronic element can emit green light or yellow light.

In one embodiment, the first optoelectronic element includes a blue light-emitting diode array and a first wavelength converter such as a phosphor, a semiconductor, and a dye. The blue light-emitting diode array includes blue light-emitting diode chips which can be connected in series, parallel, or a combination thereof. The first wavelength converter can be overlaid on the blue light-emitting diode array. In addition, the second optoelectronic element can be a red light-emitting diode chip, a red light-emitting diode array, a combination of a blue light-emitting diode chip and a red wavelength converter, or a combination of a blue light-emitting diode array and a red wavelength converter.

In a further embodiment, a multi-dimensional light-emitting device is electrically connected to a standardized power supply system. The multi-dimensional light-emitting device includes a carrier, a blue light-emitting diode array, a first wavelength converter, and second wavelength converters. The blue light-emitting diode array is arranged on the carrier and includes blue light-emitting diode chips which are electrically connected with each other. The blue light-emitting diode array has a central area and peripheral areas surrounding the central area. However, one peripheral area may overlap the central area and/or another peripheral area. The first wavelength converter can cover at least part of the central area. Each second wavelength converter can cover at least part of one peripheral area. Moreover, the wavelength converters may overlap with each other. The area or the wavelength converter can meet the required color temperature, hue, light field, light intensity, luminous efficiency, or other criteria by adjusting the layout, the position, the area, the thickness, and/or the concentration. The standardized power supply system is electrically connected to the blue light-emitting diode array such that the central area and at least one of the peripheral areas respectively produce a first light and a second light which can be mixed with the first light to produce a mixed light. In other words, the peripheral areas can produce light at the same time or different times.

DETAILED DESCRIPTION OF PREFERRED EMBODIMENTS

Figure 1A:
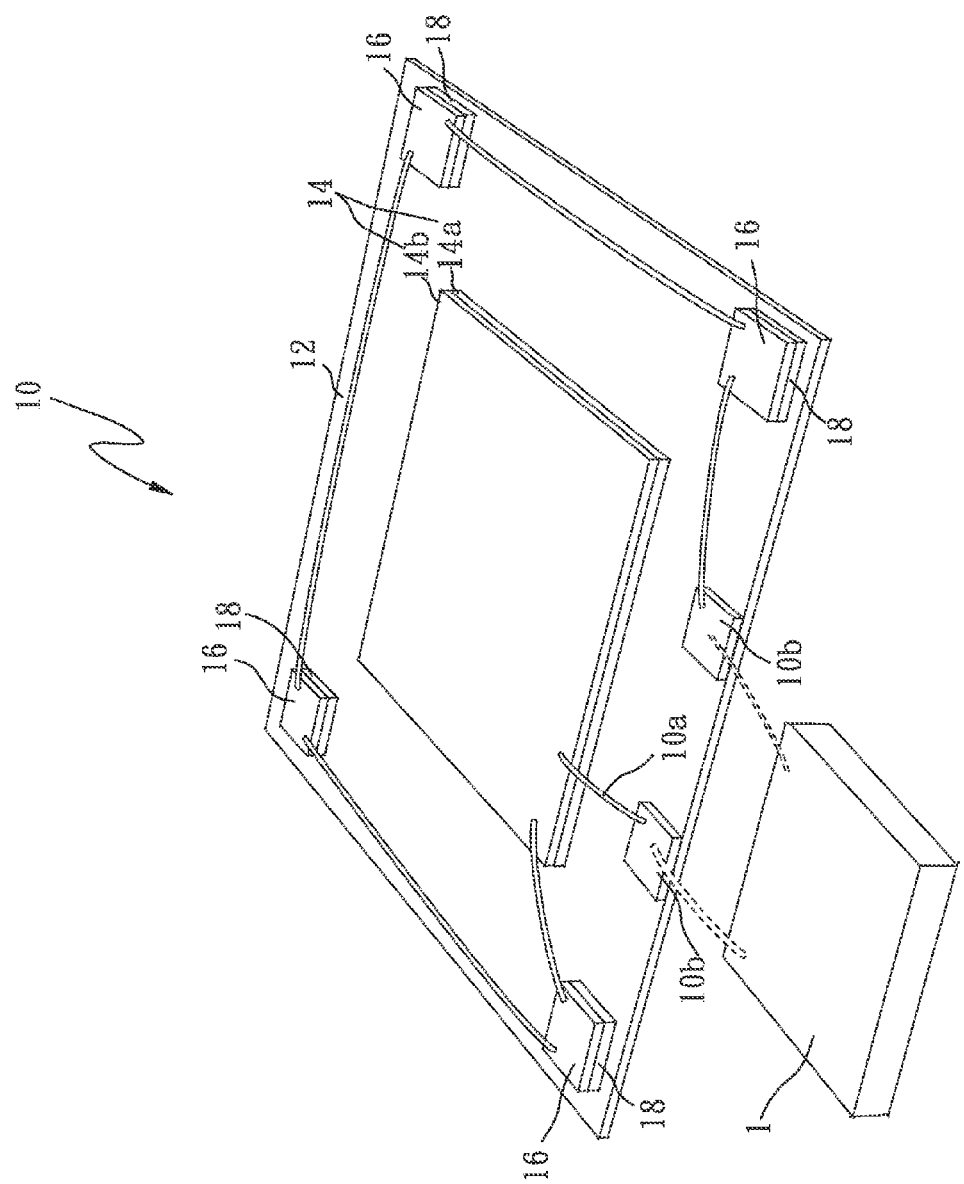
FIGS. 1A and 1B illustrate a multi-dimensional light-emitting device in accordance with one embodiment of the present application.

The embodiments are described hereinafter in accompany with drawings. However, the embodiments of the present application are not to limit the condition(s), the application(s), or the mythology. The embodiments can be referred, exchanged, incorporated, collocated, coordinated except they are conflicted, incompatible, or hard to be put into practice together. Moreover, the drawing(s) are generally illustrated in simplified version(s). The element(s), quantities, shape(s), or other characteristic(s) are not to limit the specific application.

Figure 1B:
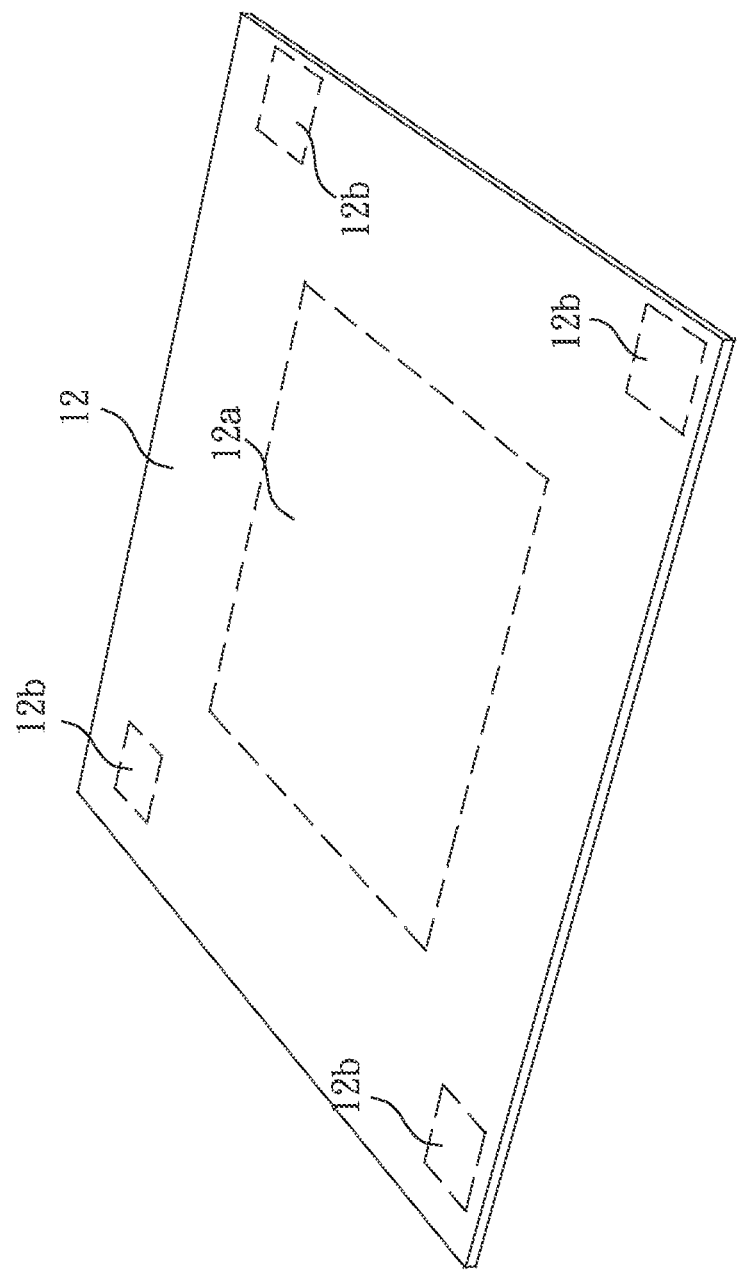

Firstly, referring to FIG. 1A, a multi-dimensional light-emitting device 10 in accordance with one embodiment of the present application is illustrated. The multi-dimensional light-emitting device 10 can be electrically connected to a standardized power supply system 1 such as power line, network, telephone line, and industrial power supply. The multi-dimensional light-emitting device 10 includes conductive lines 10a, electrodes 10b, a carrier 12, a first optoelectronic element 14, second optoelectronic elements 16, and heat dissipation structures 18. As shown in FIG. 1B, the carrier 12 can be partitioned into a first region 12a and four second regions 12b. The four second regions 12b surround the first region 12a in a configuration such as random distribution, mirror symmetry, rotational symmetry, and radial symmetry.

The first optoelectronic element 14 includes a blue light-emitting diode array 14a and a first wavelength converter 14b. The blue light-emitting diode array 14a includes several blue light-emitting diodes (not shown). The blue light-emitting diodes are arranged in a multi-dimensional configuration such as zigzag type, crossing type, and/or U type. The blue light-emitting diodes can be electrically connected with each other in series, parallel, or a combination thereof. By the multi-dimensional configuration, the light-emitting diode array 14a has an operation voltage and/or an operation current being higher than a single chip. The array 14a can be directly connected to the standardized power supply system 1, or connected to the standardized power supply system 1 in combination with a second optoelectronic element 16. Specifically, one or more light-emitting diode array 14a, which are connected with each other in series, can be optionally connected to the second optoelectronic element 16, a resister, a capacitor, and/or an inductor in series, parallel, or a combination of series and parallel, and then connected to the standardized power supply system 1. For example, the standardized power supply system 1 can provide a voltage of X volt. One light-emitting diode array 14a can accept a voltage equal to or near X//N volt (N is any integer). Provided N light-emitting diode arrays 14a are connected in series, the arrays can work at X volt.

The blue light-emitting diode array 14a can be arranged on the first region 12a of the carrier 12 through a suitable connecting material (not shown). The first wavelength material 14b is arranged to overlay the blue light-emitting diode array 14a. Preferably, the first wavelength converter 14b is a yellow wavelength converter such as a yellow phosphor, a yellow dye, and/or a yellow filter. The yellow phosphor is such as YAG, TAG, nitride phosphor, and silicate phosphor.

In the present embodiment, at least one of the four second optoelectronic elements 16 in FIG. 1A, which includes a red light-emitting diode array (i.e. including several red light-emitting diode chips) or a red light-emitting diode chip, is arranged on the second region 12b of the carrier 12 by a suitable connecting material (not shown). Preferably, to prevent the red light-emitting diode array from absorbing the light from the blue light-emitting diode array 14a or being deteriorated by the heat from the blue light-emitting diode array 14a, the blue light-emitting diode array 14a and the red light-emitting diode array are separated from each other by a suitable distance. The distance is greater than 0.5 mm, 1 mm, 2.0 mm, 3.0 mm, 4.0 mm, 5.0 mm, 1.0 cm, 2.0 cm, 3.0 cm, 4.0 cm, or 5.0 cm. Furthermore, the red light-emitting diode array or chip can be operated under a voltage smaller than, equal to, close to, or greater than that of the blue light-emitting diode array 14a.

The standardized power supply system 1 can be electrically connected to each of the electrodes 10b of the multi-dimensional light-emitting device 10. As shown in FIG. 1A, the electrodes 10b, the first optoelectronic element 14, and the second optoelectronic elements 16 are electrically connected with each other by several conductive lines 10a. The standardized power supply system 1 can make the first optoelectronic element 14 and each of the second optoelectronic elements 16 to emit a first light and a second light respectively in order to produce a mixed light. The mixed light has a color temperature equivalent to a candlelight of 1500K~2500K, an incandescent lamp of 2500K~3500K, a high intensity discharge lamp of 4500K~5000K, and/or a flash light of 5500K~5600K. The color temperature of less than 3300K is usually called as "warm white"; the color temperature between 3300K and 5300K is usually called as "cool white"; the color temperature of more than 5300K is usually called as "cool color light". A variety of color temperatures in the mixed light can be achieved by using the design principle illustrated in the embodiments of the present application.

In comparison with the blue light-emitting diode, the efficiency of the red light-emitting diode remarkably decreases when the temperature increases. As shown in FIG. 1A, to lower the temperature of the red light-emitting diode array or chip, a heat dissipation structure 18 is further arranged under the red light-emitting diode array or chip of the second optoelectronic element 16 in accordance with one embodiment of the present application. The heat dissipation structure 18 is such as fin(s), fan(s), heat pipe(s), and liquid cooler, high thermal conductivity material bulk(s), porous material(s), and a combination thereof.

To display the mixed light in a uniform color and/or high color rendering, the first optoelectronic element 14 and the second optoelectronic element 16 can be configured such that each element meets its electrical property (such as energy efficiency, and power factor), optical property (such as light field, light intensity, hot/cold factor), and/or geometric shape. In accordance with an embodiment of the present application, a light-emitting area ratio of the first optoelectronic element 14 to all second optoelectronic elements 16 is between 2:1 to 5:1 on the carrier 12. However, the light-emitting area ratio of a single first optoelectronic element 14 to a single second optoelectronic element 16 is not limited to the aforementioned range. In another embodiment of the present application, a power ratio of the first optoelectronic element 14 to all second optoelectronic elements 16 is between 2 and 5, however, the ratio of a single first optoelectronic element 14 to a single second optoelectronic element 16 is not limited to the aforementioned range. In addition, provided one element can deteriorate another element by its light, heat, magnetic field, and/or electric field, the distance between the elements or the layout of elements is preferably configured to reduce or remove the deterioration. For example, the material with low energy band gap can absorb high energy light. The material with high hot/cold factor has lower light-emitting efficiency at high temperature. A counter magnetic field hinders the combination of electrons and holes. In one embodiment of the present application, for example, the neighboring elements in the multi-dimensional light-emitting device 10 are separated from each other by a distance or tilted with each other in an angle such that there is no or least overlap between the elements' light fields, which renders a uniform color distribution.

In an embodiment, the first optoelectronic element 14 and the second optoelectronic element 16 are electrically connected to the standardized power supply system 1 in series. The blue light-emitting diode array 14a, and the red light-emitting diode array or chip, therefore, can be operated at high voltage and low current (in comparison with non-light-emitting diode array), such that less energy loses during the energy transmission and conversion, and a simple circuit between the standardized power supply system 1 and the multi-dimensional light-emitting device can be used. The elements of the present application can be also connected in parallel or a combination of series and parallel.

In another embodiment, the material of the carrier 12 can be a single crystal, a poly crystal, or non-crystal, such as glass, sapphire, SiC, GaP, GAAsP, ZnSe, ZnS, AmSSe, and AlN.

Moreover, in the first optoelectronic element 14, gallium nitride (GaN) series chips can be used in the blue light-emitting diode array 14a to emit blue light with a wavelength of 400 nm~530 nm (or 455 nm~465 nm). A yellow phosphor, such as yttrium aluminum garnet (YAG), can be used as the first wavelength converter 14b. In another embodiment, other yellow phosphors (such as TAG, nitride series phosphor, silicate series phosphor), fluorescent plate, semiconductor, and dye can also be used. In the second optoelectronic element 16, AlGaInP series chip can be used in the red light-emitting diode array to emit red light with a wavelength of 600 nm~750 nm (or 620 nm~625 nm). The material of the heat dissipation structure can be selected from high conductivity materials such as copper (Cu), aluminum (Al), and silicon (Si). The heat dissipation structure can also be made of ceramic material(s). However, the aforementioned materials are only illustrative, and not to limit the scope of the present invention. The color light can have various color temperature by adjusting the quantity or the light intensity of the blue light-emitting diode array 14a, the thickness or the concentration of the wavelength converter, and/or the mixture ratio of the blue light to the red light.

Figure 2:
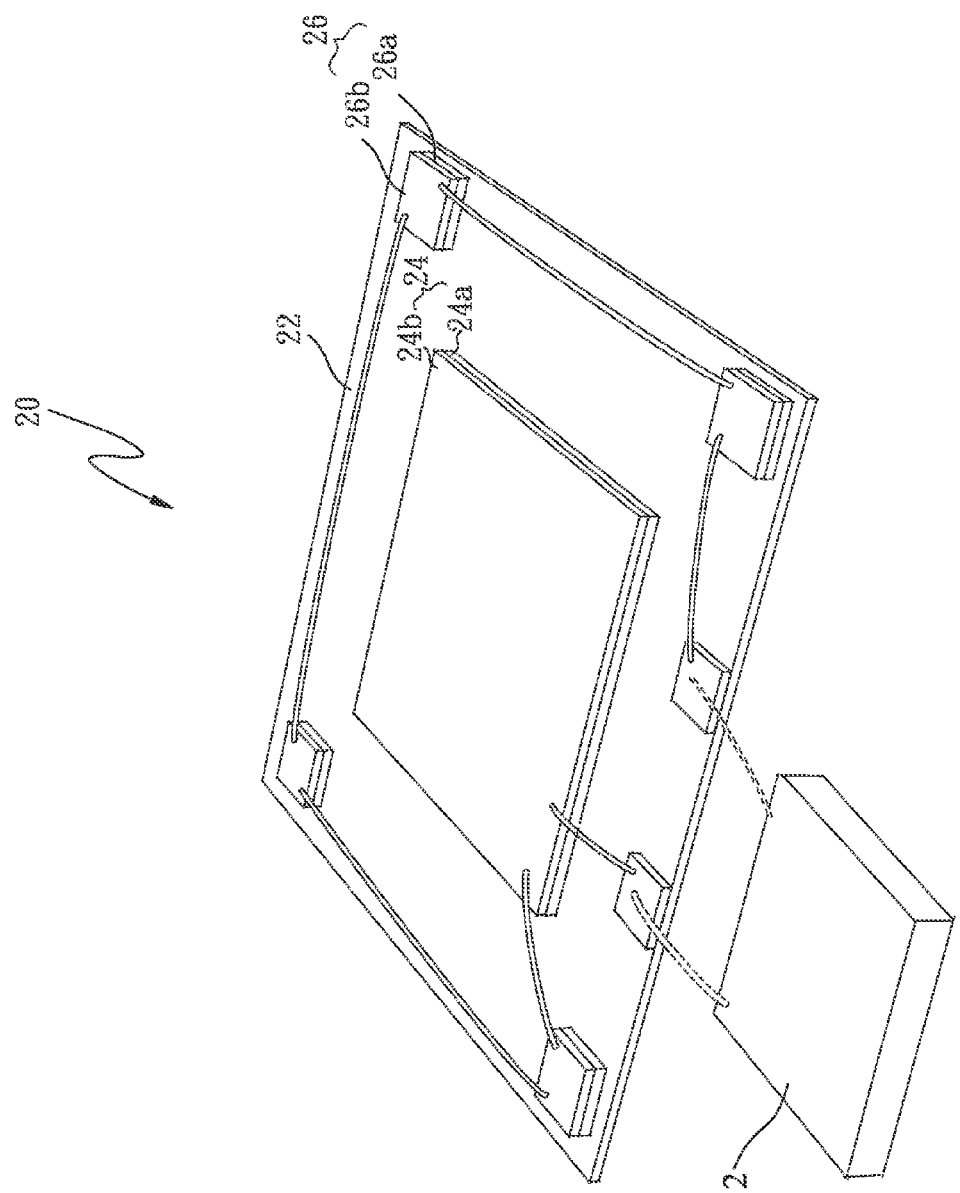
FIG. 2 illustrates a multi-dimensional light-emitting device in accordance with another embodiment of the present application.

Referring to FIG. 2, a multi-dimensional light-emitting device in accordance with a further embodiment of the present application is disclosed. A multi-dimensional light-emitting device 20 is electrically connected to a standardized power supply system 2. The multi-dimensional light-emitting device 20 includes a carrier 22, a first optoelectronic element 24, and second optoelectronic elements 26. The first optoelectronic element 24 includes a blue light-emitting array 24a and a first wavelength converter 24b. The second optoelectronic element 26 includes a blue light-emitting array 26a and a second wavelength converter 26b. The first wavelength converter 24b includes one yellow wavelength converter. The second wavelength converter 26b includes one red wavelength converter.

In addition, in the present embodiment, the first wavelength converter 24b and the second wavelength converter 26b can be arranged on separate elements, or stacked on the same element. Both of the first optoelectronic element 24 and the second optoelectronic element 26 are blue light-emitting diode arrays, therefore, light absorption among the elements can be prevented. Moreover, the distance between the blue light-emitting diode arrays of the optoelectronic elements can be as short as possible in order to reduce the packaging area.

Figure 3:
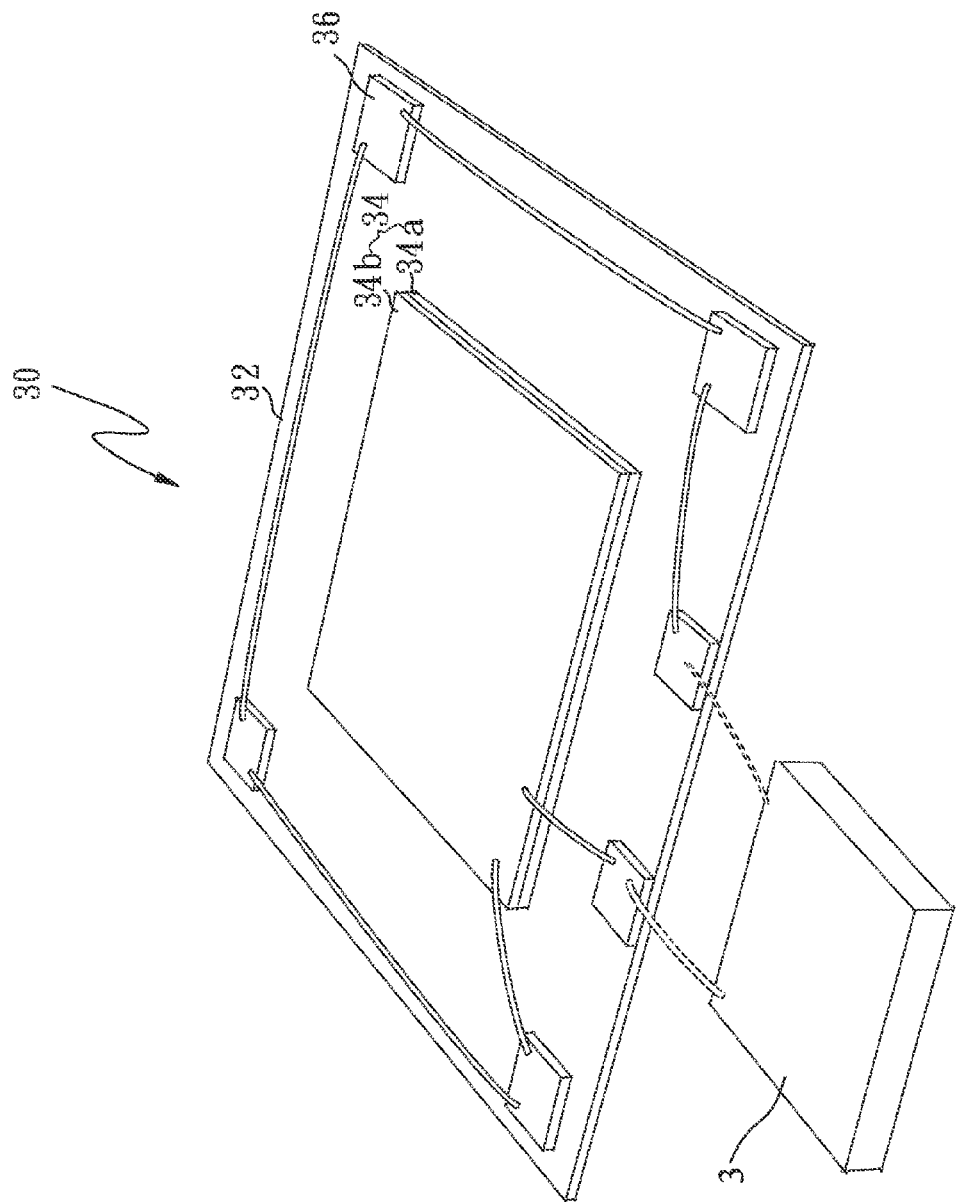
FIG. 3 illustrates a multi-dimensional light-emitting device in accordance with one embodiment of the present application.

FIG. 3 is a perspective view of a multi-dimensional light-emitting device 30 in accordance with an embodiment of the present application.

The multi-dimensional light-emitting device 30 in the present embodiment is also electrically connected to a standardized power supply system 3. The multi-dimensional light-emitting device 30 includes conductive lines 30a, two electrodes 30b, a carrier 32, a first optoelectronic element 34, and four second optoelectronic elements 36.

In detail, a blue light-emitting diode array is used to excite the first wavelength converter 34b of a red phosphor in the first optoelectronic element 34 of the present embodiment. A green light-emitting diode array having several green light-emitting diode chips is used in the second optoelectronic element 36. However, a single green light-emitting diode chip may be used in other embodiments.

The standardized power supply system 3 is electrically connected to the multi-dimensional light-emitting device 30 and provides a standardized voltage and/or current. The first optoelectronic element 34 and the second optoelectronic element 36 can emit a first light and a second light. The first light can be mixed with the second light to produce a mixed light. The mixed light can include a blue light, a red light, and a green light. Various color lights, such as warm white, cool white, and other color light which can be generated by a mixture of primary colors, can be produced by mixing the three colors in different proportion. Furthermore, the percentage of the blue light in the mixed light can be close to 0, less than 5%, or less than 1%, if most or all of the blue light is used in generating red light.

Figure 4:
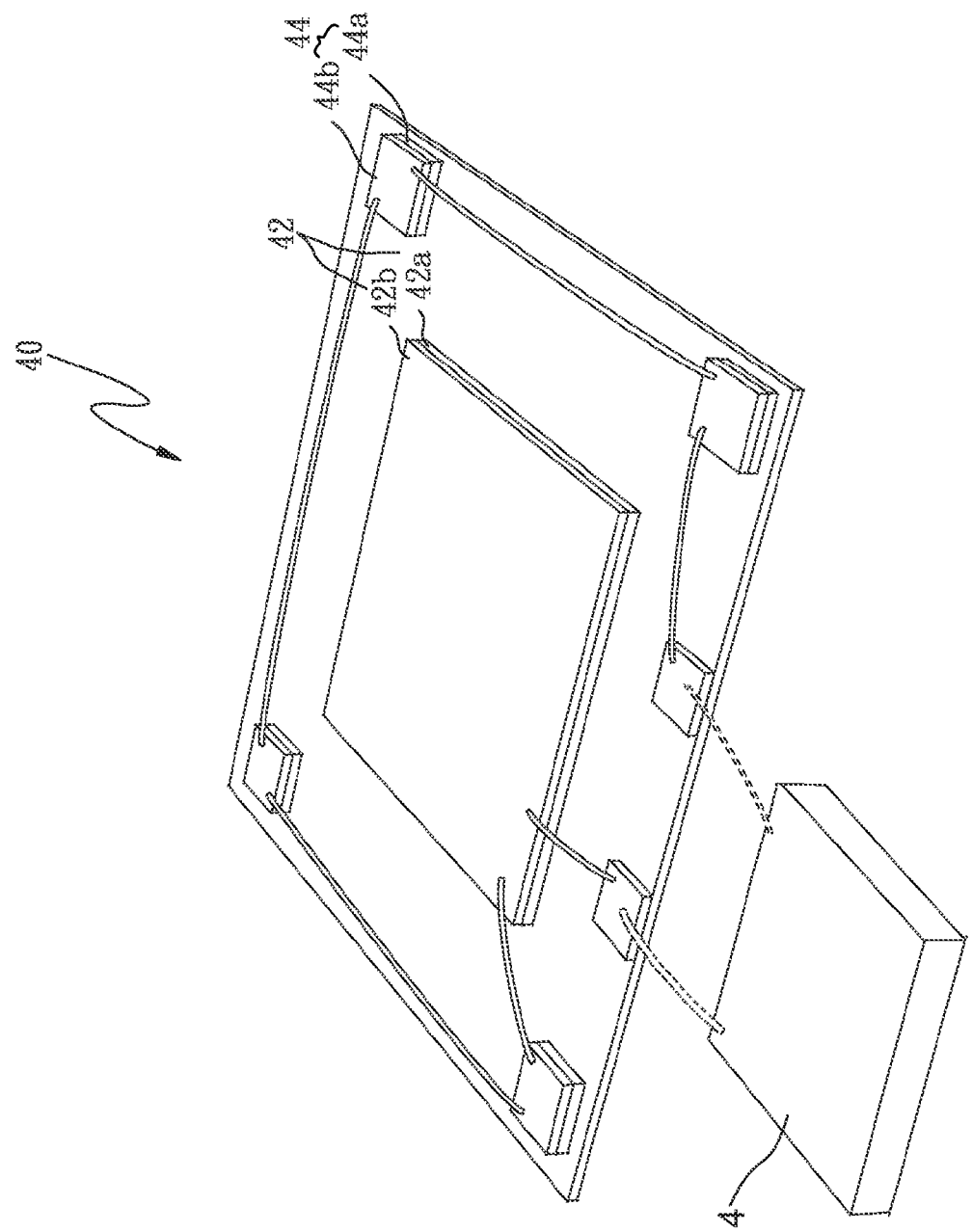
FIG. 4 illustrates a multi-dimensional light-emitting device in accordance with a further embodiment of the present application.

FIG. 4 illustrates a multi-dimensional light-emitting device 40 in accordance with another embodiment of the present application. The multi-dimensional light-emitting device 40 is electrically connected to a standardized power supply system 4. In the present embodiment, a blue light-emitting diode array 42a is used to excite a first wavelength converter 42b of a red phosphor to generate a first light in the first optoelectronic element 42. In the second optoelectronic element 44, a blue light-emitting diode array 44a is used to excite a green wavelength converter 44b positioned above to generate a second light which can be mixed with the first light into a mixed light. In such an arrangement, various visible lights can be produced by mixing the blue light, red light, and green light in different proportions. However, the blue light may be hardly perceivable in the mixed light, if most or all of the blue light is used to generate the red light and the green light.

In the present embodiment, the first wavelength converter 42b and the second wavelength converter 44b can be arranged on separate elements, or stacked on the same element. Both of the first optoelectronic element 42 and the second optoelectronic element 44 are blue light-emitting diode arrays, therefore, light absorption among the elements can be prevented. Moreover, the distance between the blue light-emitting diode arrays of the optoelectronic elements can be as short as possible in order to reduce the packaging area.

In the aforementioned embodiments, provided the blue light-emitting diode arrays are used in the first region and the second region, the distance between the first region and the second region can be reduced due to the low absorption rate of the blue light-emitting diode when being exposed to other wavelength(s), such as those in the two aforementioned embodiments. However, provided different color light-emitting diode arrays, such as blue and red light-emitting diodes, or blue and green light-emitting diodes, are used in the first region and the second region, a longer distance is preferable, because the red light-emitting diode or the green light-emitting diode has a higher absorption rate to other wavelength. Besides, the light-emitting diode array in the second region may be replaced by a single chip.

Figure 5A:
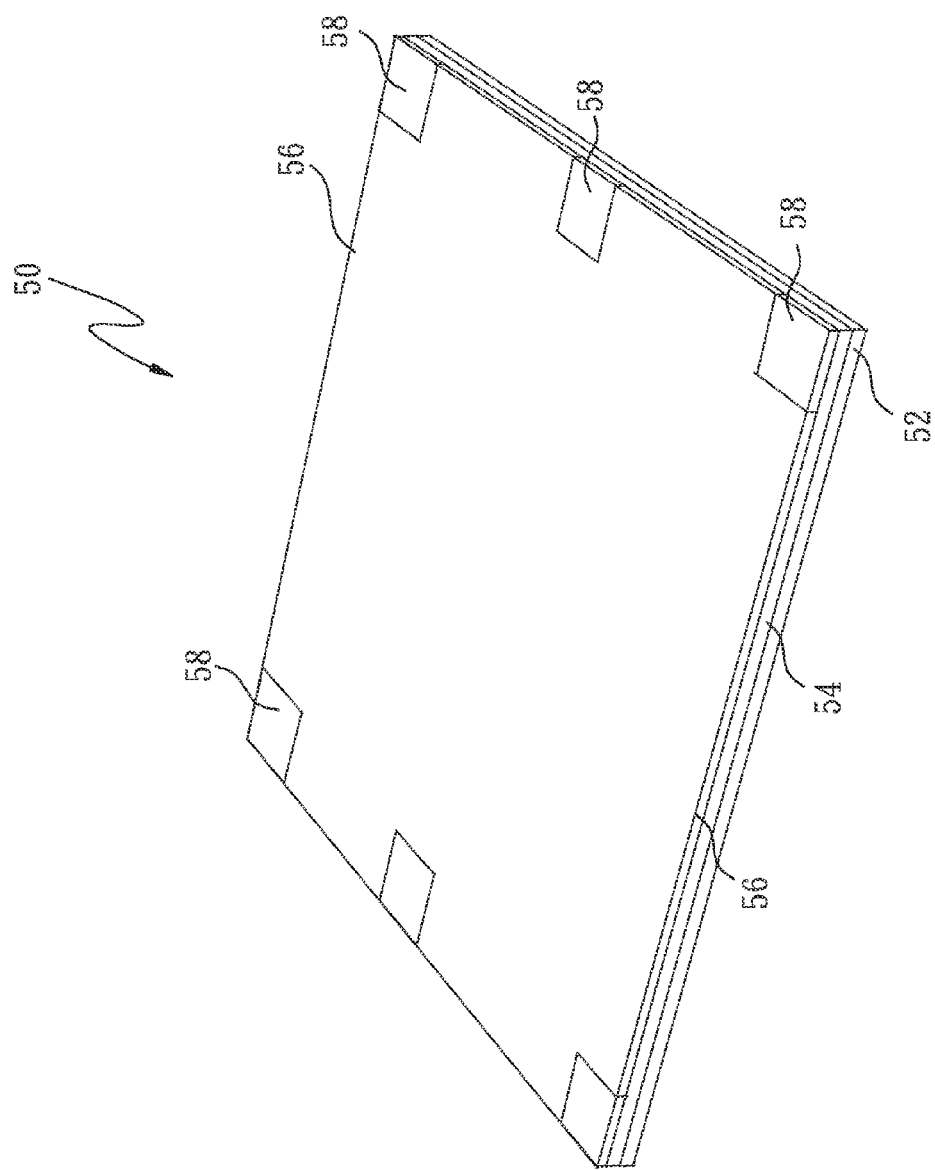
FIGS. 5A and 5B illustrate a multi-dimensional light-emitting device in accordance with one embodiment of the present application.

FIG. 5A illustrates a multi-dimensional light-emitting device 50 in accordance with a further embodiment of the present application. The multi-dimensional light-emitting device 50 is electrically connected to a standardized power supply system (not shown). The multi-dimensional light-emitting device includes a carrier 52, a blue light-emitting diode array 54, a first wavelength converter 56, and four second wavelength converters 58.

Figure 5B:
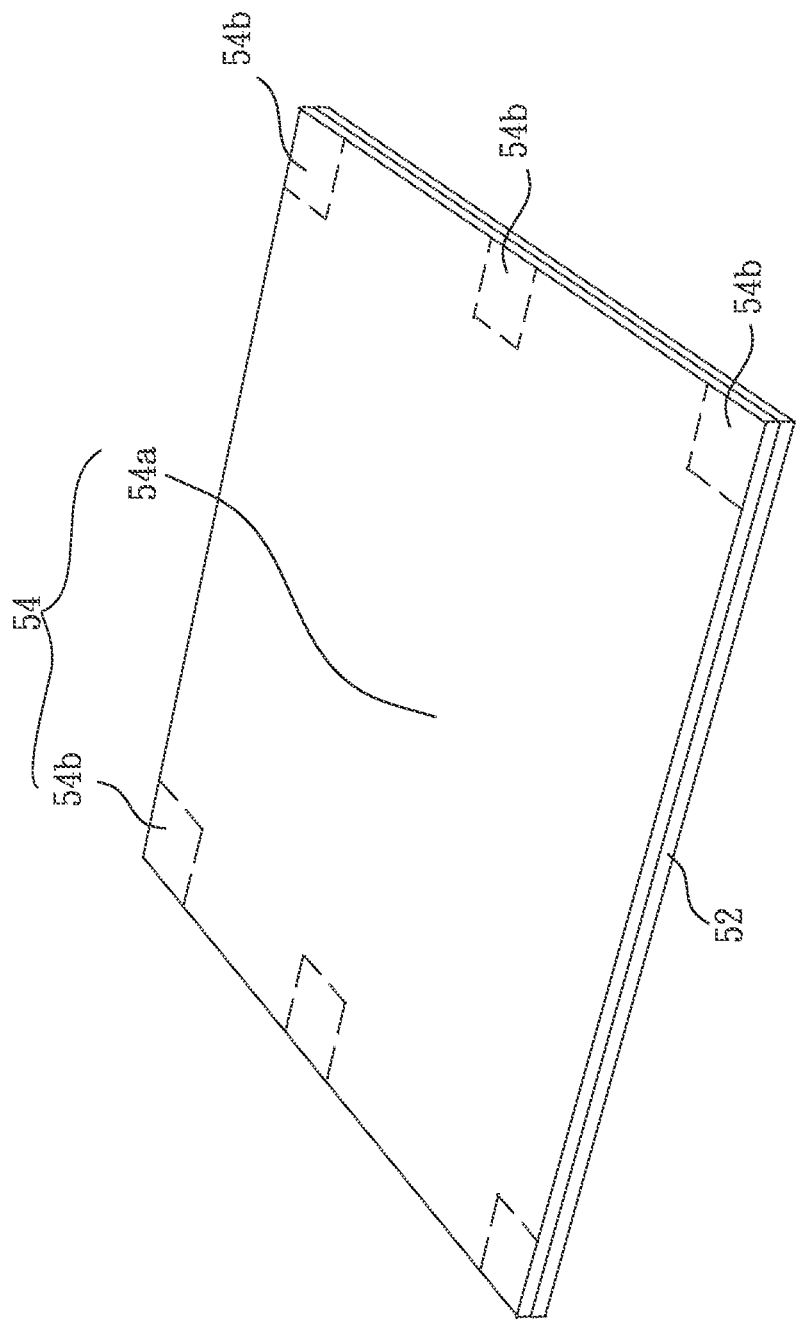

The blue light-emitting diode array 54 is arranged on the carrier 52 and has several blue light-emitting diode chips (not shown). The several blue light-emitting diode chips are electrically connected with each other in series, parallel, or a multi-dimensional configuration of series and parallel connections. As shown in FIG. 5B, the blue light-emitting diode array 54 has a central area 54a and four peripheral areas 54b surrounding the central area 54a. As shown in FIG. 5A, the first wavelength converter 56 is overlaid on the central area 54s; the four second wavelength converter 58 are respectively overlaid on the four peripheral areas 54b.

In the present embodiment, the material selections and the practices of the carrier 52, the blue light-emitting diode array 54, the first wavelength converter 52a, and the second wavelength converter 52a can be referred to the aforementioned descriptions.

The standardized power supply system is electrically connected to the blue light-emitting diode array 54. A first light and a second light can be respectively generated from the central area 54a and the peripheral areas 54b of the blue light-emitting diodes array 54. The first light can be mixed with the second light to produce a mixed light.

Figure 6A:
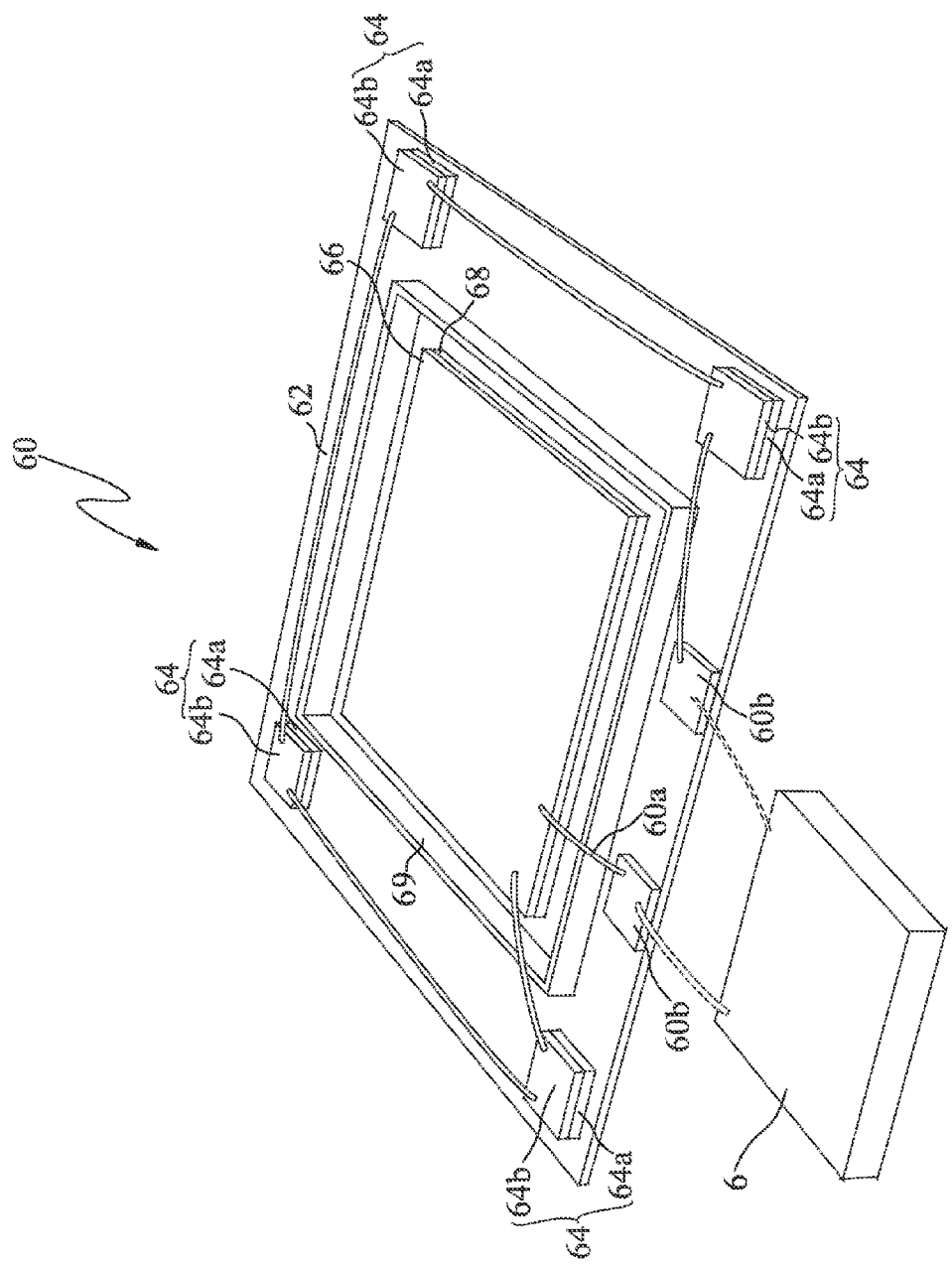
FIGS. 6A to 6E illustrate multi-dimensional light-emitting devices in accordance with embodiments of the present application.
Figure 6B:
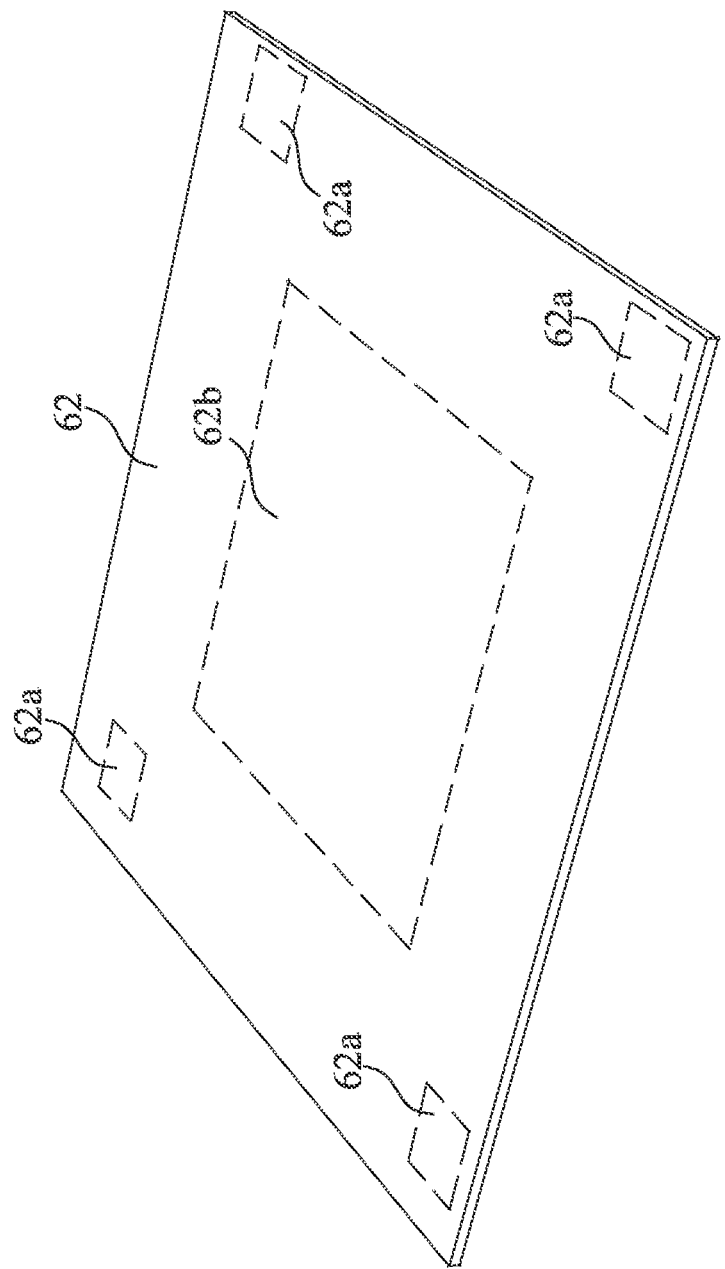

FIG. 6A illustrates a multi-dimensional light-emitting device 60 in accordance with a further embodiment of the present application. The multi-dimensional light-emitting device 60 is electrically connected to a standardized power supply system 6. The multi-dimensional light-emitting device 60 includes conductive lines 60a, two electrodes 60b, a carrier 62, four first optoelectronic elements 64, a second optoelectronic element 66, and a heat dissipation structure 68. As shown in FIG. 6B, the carrier 62 has four first regions 62a and a second region 62b. The first regions 62a surround the second region 62b.

Referring to FIGS. 6A and 6B, each first optoelectronic element 64 includes a blue light-emitting diode array 64a (in the present application, all or part of the blue light-emitting diode array can be replaced by a blue light-emitting diode chip), and a first wavelength converter 64b. The blue light-emitting diode array 64a includes several blue light-emitting diode chips (not shown). The blue light-emitting diode chips can sustain a forward voltage and/or a current higher than that of a single semiconductor light-emitting epitaxial structure by connecting with each other in a multi-dimensional configuration (such as zigzag type, crossing type, and U type) of series, parallel, or a combination of series and parallel. Four of the blue light-emitting diode arrays 64a are mounted on the four first regions 62a of the carrier 62 by a mounting material (not shown). The first wavelength converter 64b is overlaid on the blue light-emitting diode array 64a. The first wavelength converter 64b can emit light of yellow, red, or green.

As shown in FIG. 6A, the second optoelectronic element 66 in the present embodiment includes a red light-emitting diode array (or a single red light-emitting diode chip) arranged on the second region 62b of the carrier 62. The blue light-emitting diode array 64a is separated from the red light-emitting diode array by a suitable distance, such that the red light-emitting diode array is prevented from absorbing the light from the blue light-emitting diode array 64a. In addition, provided the blue light-emitting diode array, the red light-emitting diode array, or both are arranged in a lower structure which can obstruct the light transmission, or have a larger margin which can increase a distance between two neighboring light-emitting diode arrays, or have an obstructing structure between the blue and red light-emitting diode arrays. For example, a light obstructer 69 can prevent the red light-emitting diode array from absorbing the light from the blue light-emitting diode array 64a.

The standardized power supply system (not shown) can be electrically connected to each of electrodes 60b of the multi-dimensional light-emitting device 60. As shown in FIG. 6A, the electrode(s) 60b, the first optoelectronic element(s) 64, and the second optoelectronic element(s) 66 are series-connected by conductive lines 60a. The first optoelectronic element(s) 64 and the second optoelectronic element(s) 66 can respectively emit a first light and a second light. The two lights can be mixed into a mixed light. Preferably, the color temperature of the mixed light is ranged between 2500K and 3800K, more preferably, the color temperature is about 3000K or in a range of warm white.

The luminous efficiency of the red light-emitting diode apparently decays more when the temperature rises. Therefore, as shown in FIG. 6A, a heat dissipation structure 68, which can cool the red light-emitting diode array, is arranged under the red light-emitting diode array, i.e. between the second optoelectronic element 66 and the carrier 62, such that the issue of the power decaying at high temperature can be relieved. The heat dissipation structure 68 is such as fin(s), fan(s), heat pipe(s), liquid cooler(s), high conductivity material(s), and porous material(s). Besides, the heat dissipation structure 68 can be optionally arranged on a position higher than a blue light-emitting diode array 64a, such that, when an optical lens is arranged on the multi-dimensional light-emitting device 60, more light can be extracted from the second optoelectronic element 66 which is positioned near an optical axis of the optical lens but not in the periphery of the multi-dimensional light-emitting device 60 (such as in the embodiments of FIGS. 1A-4). The first wavelength converter 64b can include particle(s) which can scatter light (such as phosphors, scattering particles). In this case, even though the first optoelectronic elements 64 are arranged on the periphery of the multi-dimensional light-emitting device 60, the light can still be extracted outwards by the particles.

To produce light having uniform color and/or good rendering, the first optoelectronic element(s) 64 and the second optoelectronic element 66 are arranged on the carrier 62 by a light-emitting area ratio of 2:1~5:1 (the related drawings are only for illustrative, but not to reflect the actual scale.). Optionally, in one embodiment, the power ratio of blue light of the first optoelectronic element(s) 64 to the red light of the second optoelectronic element(s) 66 is ranged between 2 and 5.

In one embodiment, the first optoelectronic element 64 and the second optoelectronic element 66 are electrically connected to the standardized power supply system in series, such that the blue light-emitting diode array 64a and the red light-emitting diode array can be operated at a high voltage and a low current, which can bring to a low energy consumption operation (in comparison with non-light-emitting diode array) and a simple circuit between the standardized power supply system and the multi-dimensional light-emitting device. However, the elements in the application can also be connected in parallel or a combination of series and parallel.

Figure 6C:
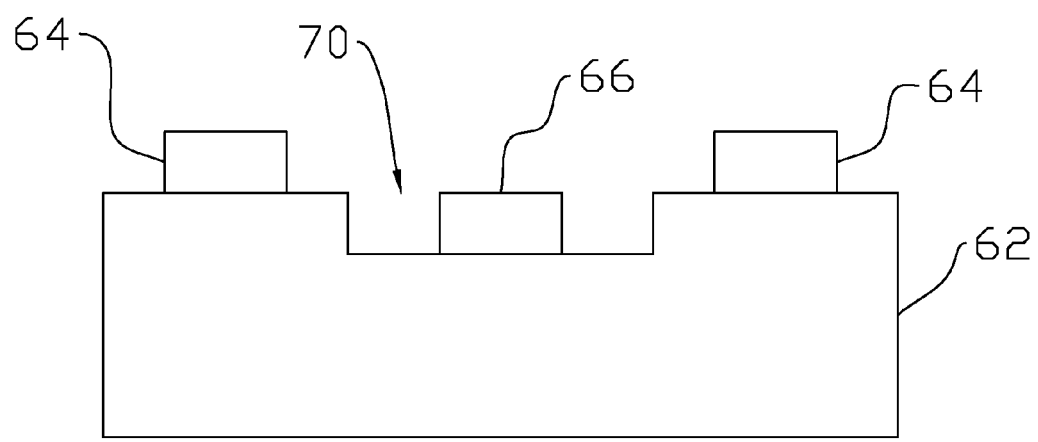

FIG. 6C illustrates a multi-dimensional light-emitting device 60 in accordance with another embodiment of the present application. As described above, the luminous efficiency of the multi-dimensional light-emitting device 60 may decrease, if the material of the second optoelectronic element 66 absorbs the light from the first optoelectronic element 64. In the present embodiment, the carrier 62 has a lower structure 70 in which the second optoelectronic element 66 is positioned. The lower structure 70 can obstruct light moving between the first optoelectronic element 64 and the second optoelectronic element 66, such that the second optoelectronic element 66 has lower possibility of absorbing the light from the first optoelectronic element 64. The luminous efficiency of the multi-dimensional light-emitting device is therefore alleviated. The lower structure 70 can be formed to be a one open-ended channel or a multi-open-ended channel, such as a blind hole and a trench.

Furthermore, a reflective layer 71 can be arranged on the lower structure 70. The light from the second optoelectronic element 66 has higher possibility to leave the lower structure 70 after being reflected by the reflective layer 71. In other words, the light from the second optoelectronic element 66 is not easily trapped in the lower structure 70. In addition, a transparent material 72 can be filled into the lower structure 70 to cover the second optoelectronic element 66. The transparent material 72 is transparent to the light from the second optoelectronic element 66 and can protect the second optoelectronic element 66 from being effected by external force, humidity, and/or temperature. The transparent material 72 can be also functioned as an optical lens if it is molded in a specific shape. The optical lens is such as a convex, a concave, and a Fresnel lens.

Figure 6D:
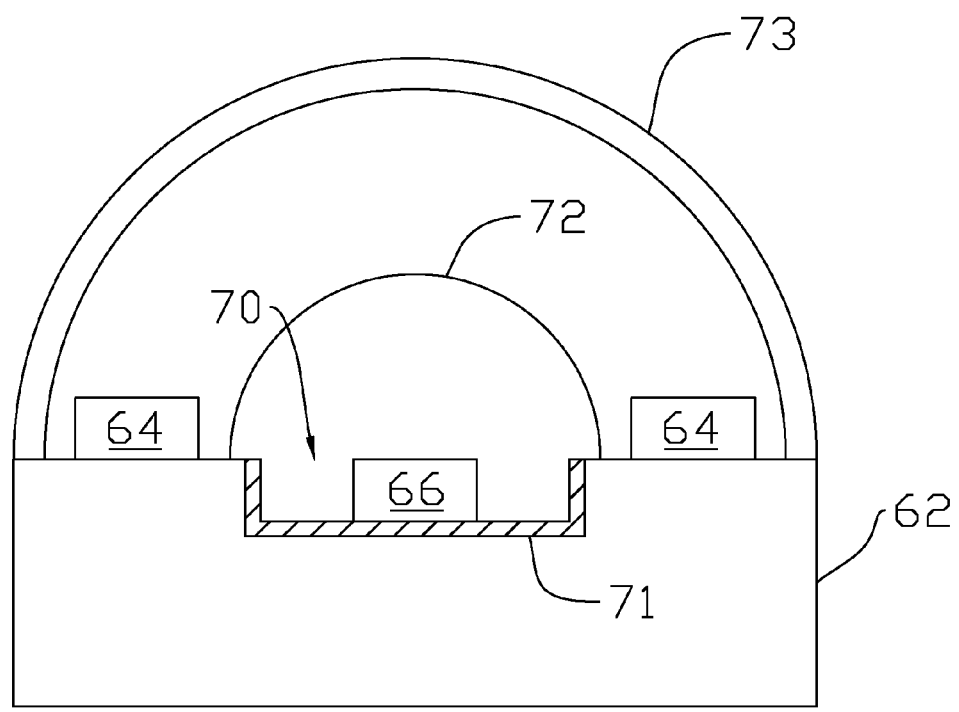

As shown in FIG. 6D, in another embodiment, a covering structure 73 can be arranged on the first optoelectronic element 64 and the second optoelectronic element 66. The covering structure 73 can protect the element(s) therein. The lights from the first optoelectronic element 64 and the optoelectronic element 66 can be mixed in the covering structure 73. The covering structure 73 is formed of transparent material(s) which can include scattering structure(s), and/or light converting structure(s). A pertinent document can be referred to Taiwan patent application Ser. No. 099141373, and the content of which is hereby incorporated by reference.

Figure 6E:
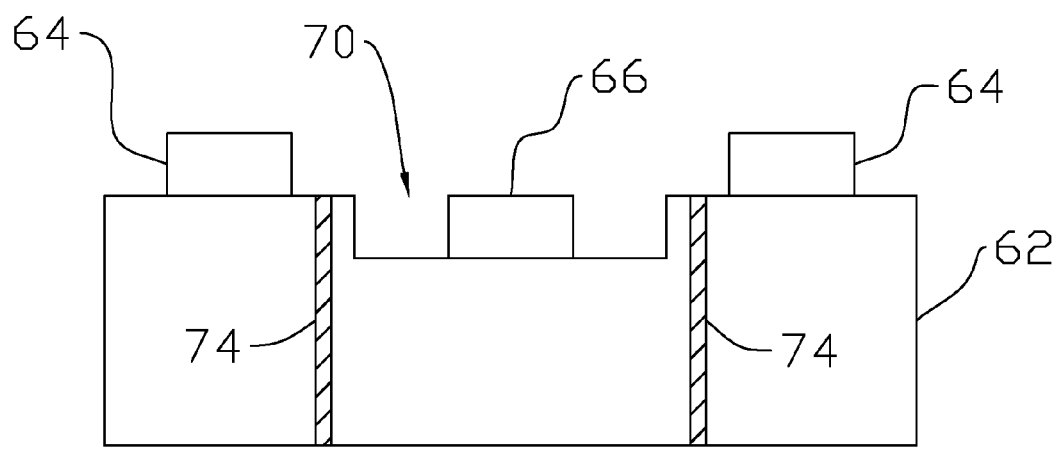

As shown in FIG. 6E, a heat insulation structure 74 can be formed between the first optoelectronic element 64 and the second optoelectronic element 66. The first optoelectronic element 64 usually has a temperature coefficient different from the second optoelectronic element 66. For example, as described above, compared with the blue light-emitting diode, the luminous efficiency of the red light-emitting diode apparently decays more when the temperature rises. The heat insulation structure 74 is beneficial to prevent thermal interaction between the optoelectronic elements, especially a heat transporting from a high temperature element to low temperature element. The heat insulation structure 74 can surround one or more elements of the same kind. For example, the heat insulation structure 74 can surround one or more first optoelectronic elements 64, or one or more second optoelectronic elements 66. The heat insulation structure 74 can be arranged in the carrier 62 to thermally separate the first optoelectronic element 64 and the second optoelectronic element 66, as shown in FIG. 6E. However, the heat insulation structure 74 can be also arranged under the optoelectronic element to block the heat from transmitting downwards or transmitted upwards. For example, the heat insulation structure 74 can be arranged between the reflective layer 71 and the carrier 62, or between the optoelectronic element and the carrier 62.

The foregoing description has been directed to the specific embodiments of this invention. It will be apparent; however, that other alternatives and modifications may be made to the embodiments without escaping the spirit and scope of the invention.

What is claimed is:

1. A light-emitting device, comprising:
    a first optoelectronic element configured to emit a first light and comprising:
        a blue light-emitting diode chip having a first bottom surface; and
        a first wavelength converter arranged on the blue light-emitting diode chip; and
    a plurality of second optoelectronic elements configured to emit a second light having a wavelength longer than that of the first light and having a second bottom surface lower than the first bottom surface;
    wherein at least one of the plurality of second optoelectronic elements has a temperature coefficient different from that of the blue light-emitting diode chip, and
    wherein the first light can be mixed with the second light to produce a mixed light having a color temperature between 2500K and 3800K.

2. The light-emitting device of claim 1, further comprising a carrier which comprises a first region on which the first optoelectronic element is arranged, and a second region on which the plurality of second optoelectronic elements is arranged.

3. The light-emitting device of claim 2, wherein the first region substantially surrounds the second region.

4. The light-emitting device of claim 2, wherein the first region comprises a single-open-end channel or a multi-open-end channel.

5. The light-emitting device of claim 2, further comprising a reflective layer arranged on the second region.

6. The light-emitting device of claim 2, further comprising a transparent material arranged on the second region and covering the plurality of second optoelectronic elements.

7. The light-emitting device of claim 6, wherein the transparent material is configured to function as an optical lens.

8. The light-emitting device of claim 1, further comprising a covering structure arranged on the first optoelectronic element and the plurality of second optoelectronic elements.

9. The light-emitting device of claim 8, wherein the covering structure comprising a scattering structure or a light converting structure.

10. The light-emitting device of claim 1, further comprising a thermal insulation structure arranged between the first optoelectronic element and the plurality of second optoelectronic elements.

11. The light-emitting device of claim 10, further comprising a carrier where the thermal insulation structure is formed.

12. The light-emitting device of claim 10, wherein the thermal insulation structure substantially surrounds the plurality of second optoelectronic elements.

13. The light-emitting device of claim 1, wherein the first optoelectronic element further comprises a plurality of blue light-emitting diode chips electrically connected to each other in series.

14. The light-emitting device of claim 1, wherein the plurality of second optoelectronic elements are electrically connected to each other in series.

15. A light-emitting device, comprising:
    a first optoelectronic element configured to emit a first light and comprising:
        a blue light-emitting diode chip having a first top surface, a first bottom surface, and a side surface between the first top surface and the first bottom surface and a first wavelength converter arranged on the first top surface and substantially not covering the first bottom surface; and a plurality of second optoelectronic elements comprising a red light-emitting diode chip or a green light-emitting diode chip configured to emit a second light having a wavelength longer than that of the first light and having a second bottom surface lower than the first bottom surface in a view from the first side surface.

16. The light-emitting device of claim 15, further comprising a carrier which comprises a first region on which the first optoelectronic element is arranged, and a second region on which the plurality of second optoelectronic elements is arranged, wherein the first region substantially surrounds the second region.

17. A light-emitting device, comprising:
a first optoelectronic element configured to emit a first light and comprising:
a blue light-emitting diode chip having a first top surface, a first bottom surface, and a side surface between the first top surface and the first bottom surface; and
a first wavelength converter arranged on the first top surface and substantially not covering the first bottom surface; and
a plurality of second optoelectronic elements configured to emit a second light having a wavelength longer than that of the first light and having a second bottom surface lower than the first bottom surface in a view from the first side surface;
one or more second wavelength converters arranged on at least one of the plurality of the second optoelectronic elements.

18. The light-emitting device of claim 17, wherein the first wavelength converter comprises a yellow wavelength converter, the second wavelength converter comprises a red wavelength converter.

19. The light-emitting device of claim 17, further comprising a carrier which comprises a first region on which the first optoelectronic element is arranged, and a second region on which the plurality of second optoelectronic elements is arranged, wherein the first region substantially surrounds the second region.

* * * * *